US009846381B2

United States Patent
Anthony et al.

(10) Patent No.: US 9,846,381 B2
(45) Date of Patent: Dec. 19, 2017

(54) RESISTIVE FILM WITH DUCTILE PARTICLES

(71) Applicant: Hewlett-Packard Development Company, L.P., Houston, TX (US)

(72) Inventors: Thomas Anthony, Palo Alto, CA (US); Seongsik Chang, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 15/500,907

(22) PCT Filed: Jul. 31, 2014

(86) PCT No.: PCT/US2014/049144
§ 371 (c)(1),
(2) Date: Jan. 31, 2017

(87) PCT Pub. No.: WO2016/018366
PCT Pub. Date: Feb. 4, 2016

(65) Prior Publication Data
US 2017/0235246 A1    Aug. 17, 2017

(51) Int. Cl.
*G03G 15/02*    (2006.01)
*C23C 16/44*    (2006.01)

(52) U.S. Cl.
CPC ......... *G03G 15/0233* (2013.01); *C23C 16/44* (2013.01)

(58) Field of Classification Search
CPC ........... G03G 15/0216; G03G 15/0233; G03G 15/025
USPC ........................................ 399/176
See application file for complete search history.

(56) References Cited

U.S. PATENT DOCUMENTS

| 5,089,851 | A | * | 2/1992 | Tanaka et al. ..... G03G 15/0233 399/176 |
| 5,473,418 | A | | 12/1995 | Kazakos et al. |
| 5,600,414 | A | | 2/1997 | Hyllberg |
| 6,069,346 | A | | 5/2000 | Hyllberg |
| 6,398,702 | B1 | | 6/2002 | Schlafer et al. |
| 6,560,432 | B1 | | 5/2003 | Longhenry et al. |
| 7,016,631 | B2 | | 3/2006 | Schlafer et al. |
| 7,366,448 | B2 | | 4/2008 | Taniguchi |
| 8,322,839 | B2 | | 12/2012 | Ohshima et al. |
| 8,437,663 | B2 | * | 5/2013 | Hoshio .............. G03G 15/0233 399/176 |
| 2004/0029692 | A1 | | 2/2004 | Blair et al. |
| 2008/0145591 | A1 | | 6/2008 | Elbert et al. |
| 2009/0257790 | A1 | | 10/2009 | Jansen et al. |
| 2011/0044725 | A1 | * | 2/2011 | Mayuzumi et al. ......... G03G 15/0233 399/176 |

(Continued)

FOREIGN PATENT DOCUMENTS

WO    WO-2014062153 A1    4/2014

OTHER PUBLICATIONS

Fauchais, P., "Thermal Sprayed Coatings Used Against Corrosion and Corrosive Wear", Advanced Plasma Spray Applications, www.intechopen.com, Mar. 21, 2012, 37 pp.

(Continued)

*Primary Examiner* — William J Royer
(74) *Attorney, Agent, or Firm* — Michael A. Dryja

(57) ABSTRACT

A resistive film is applied to a conductive substrate. Ductile particles are disposed substantially uniformly throughout the resistive film. Brittleness of the resistive film is thereby reduced.

15 Claims, 4 Drawing Sheets

(56) References Cited

U.S. PATENT DOCUMENTS

2011/0201485 A1    8/2011   Gilmartin et al.
2013/0170860 A1    7/2013   Martinkovic et al.
2013/0259551 A1   10/2013   Lie et al.

OTHER PUBLICATIONS

Plasma Coatings—Non and Conductive Coatings webpage, Oct. 13, 2009, <http://catalog.plasmacoatings.com/item/all-categories/non-and-conductive-coatings/item— 2 pp.

* cited by examiner

RESISTIVE FILM WITH DUCTILE PARTICLES

BACKGROUND

Electrophotographic printing devices, such as laser printing devices, form images on media like paper. In general, a photoconductive cylinder is charged over its entire surface, and then selectively discharged in accordance with the image to be formed. Charged colorant such as toner adheres to locations on the cylinder that have been discharged, and the toner is then directly or indirectly transferred from the cylinder to the media.

DETAILED DESCRIPTION

Figure 1:
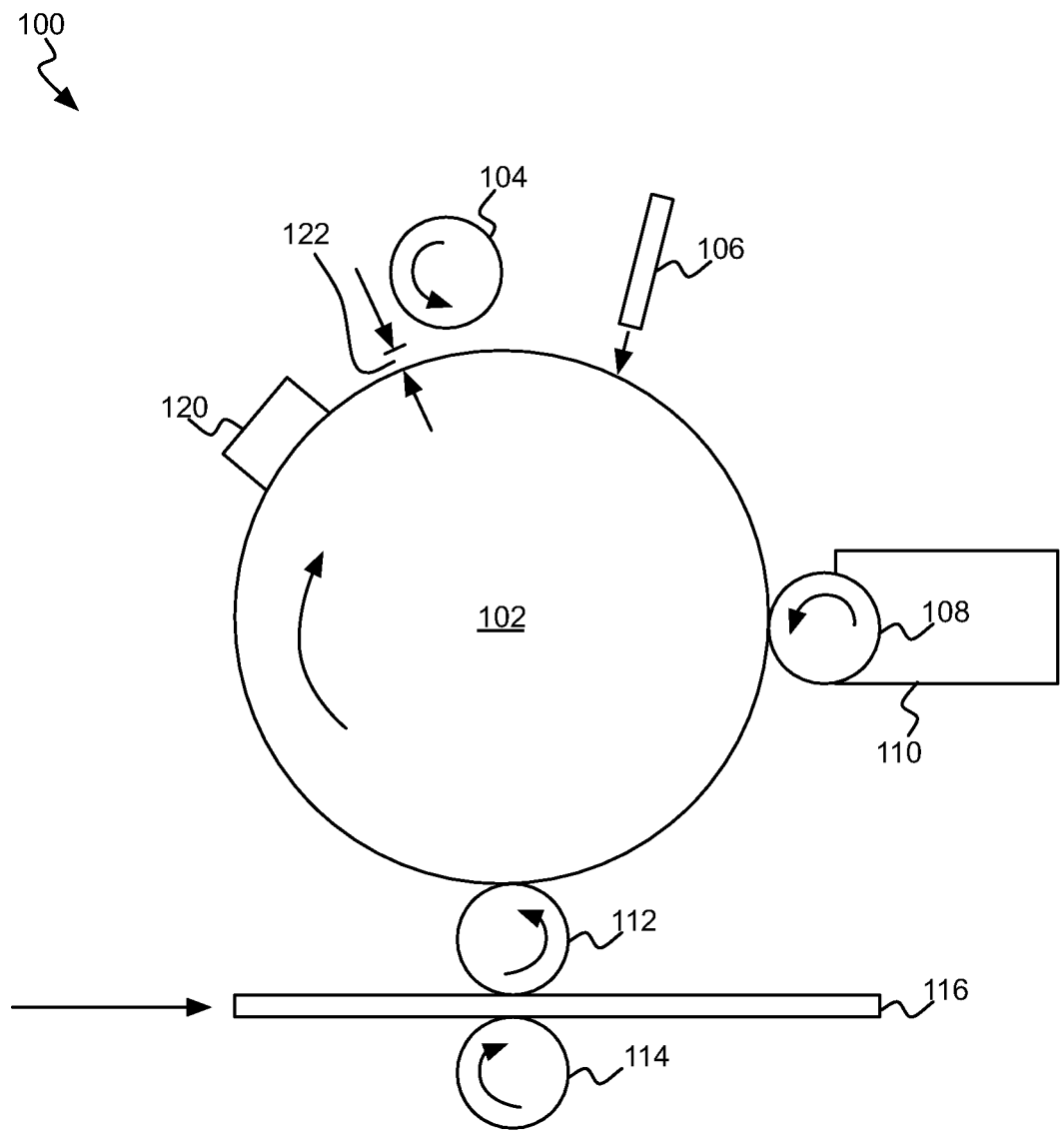
FIG. 1 is a diagram of an example electrophotographic printing device.

As noted in the background section, in electrophotographic printing devices, a photoconductive surface is charged prior to being selectively discharged with an image to be formed on media. Printing devices employ either a charge roller or a corona wire to charge the photoconductive cylinder. The charge roller has a cylindrical conductive substrate to transfer a charge to the entire surface of the photoconductive cylinder.

In some electrophotographic printing devices, the charge roller is in direct physical contact with the photoconductive cylinder while charging, and has an outermost material made of a compliant, conductive rubber so as not to physically damage the photoconductive cylinder. In other electrophotographic printing devices, the outermost material of the charge roller is a hard ceramic. As such the charge roller is usually positioned with a physical air gap between the photoconductive cylinder and the charge roller to minimize potential damage to the photoconductive cylinder.

There are at least two issues involved with the ceramic-coated charge roller's functionality of charging the photoconductive cylinder in such a way that ensures optimal print quality of the formed images on media. First, during charging of the photoconductive surface by the charge roller, high intensity discharges, which are referred to as streamers, can occur. Such high intensity discharge events can negatively affect print quality, because the photoconductive surface may not be uniformly charged.

Second, there is an optimal window of the physical gap between the charge roller and the photoconductive cylinder. If the roller-cylinder gap is less than the minimum gap specified by the window, the charge roller may contact the photoconductive cylinder if the machining tolerances of printing device components that affect the gap exceed the minimum gap. If the gap is greater than the maximum gap specified by the window, print quality is impaired.

As to the former issue, it has been found that the intensity of the streamers can be decreased by coating the metal charge roller core with a resistive film. As such, high intensity discharge events are reduced. Specifically, the intensity of the streamers is a function of the thickness of the film applied to the conductive surface, as well as electrical properties of the film.

As to the latter issue, it has been found that coating the metal charge roller core with a resistive material likewise increases the size of the optimal window of the physical roller-cylinder gap in which print quality remains high. Specifically, the maximum gap of the window is increased as the thickness of the resistive coating is increased. This is advantageous, because manufacturing tolerances and other challenges can make it difficult to precisely position the charge roller vis-à-vis the photoconductive cylinder within the confines of a small gap window.

For many types of electrophotographic printing devices, charge rollers are disposable components built into toner cartridges that are periodically replaced, or are otherwise considered periodically replaced consumable items. These types of charge rollers generally have a rubber coating as their resistive film. The rubber coating degrades relatively quickly over time, but the charge roller is regularly replaced when the toner of the toner cartridge of which the charge roller is a part is depleted and a new toner cartridge is inserted into the printing device, or when separate replacement is performed to maintain print quality.

However, for commercial production environments, charge rollers are not built into toner cartridges, and further are not considered disposable components that are to be frequently replaced. This is at least because in many such production environments, the electrophotographic printing devices are treated as digital printing presses and run nearly constantly, such that downtime is undesirable. Therefore, it is desirable for charge rollers to be considered nearly permanent components that are not normally replaced, or at most are infrequently replaced, within the printing devices.

In such electrophotographic printing devices, rubber-coated charge rollers are disadvantageous due to the impermanence of their rubber coatings. A more permanent resistive film is desirably employed, such as ceramic materials like various metal oxides, nitrides, and carbides. A noted shortcoming of such so-called permanent resistive ceramic films is that they are difficult to apply with great thickness. Above about 500 microns, the brittle ceramic films tend to crack during application to the charge roller's metal core and further may delaminate from the substrate.

A resistive coating of 500 microns or less in thickness does not result in optimal print quality, unfortunately, because high intensity discharge events are not minimized as much as desired. Furthermore, a charge roller having a resistive film 500 microns or less results in a relatively small roller-cylinder gap window in which print quality remains high. This small window can be difficult to achieve in electrophotographic printing devices without undue expense and redesign of the printing devices.

Disclosed herein are techniques to alleviate these shortcomings associated with permanent charge rollers. A charge roller for an electrophotographic printing device includes a cylindrical conductive substrate and a resistive film applied thereto to reduce high intensity discharge events. Ductile particles are disposed substantially uniformly throughout the resistive film to reduce the film's brittleness, thus reducing the likelihood of cracking and delamination, even for films greater than 500 microns in thickness. Extending film thickness beyond 500 microns increases the roller-cylinder gap window in which print quality remains high and improves print quality at operating conditions relative to a thinner film by a further reduction in high intensity discharge events, such as high intensity streamers.

FIG. 1 shows an example electrophotographic printing device 100. Cylindrical components, such as rollers, of the device 100 rotate in the directions indicated by their arrows. A photoconductive cylinder 102, which may also be referred to as a drum, rotates to receive a charge transferred by a rotating charge roller 104 across its photoconductive surface. The photoconductive cylinder 102 and the charge roller 104 are separated by a gap 122 that is within an optimal gap window in which print quality remains high.

An optical discharge mechanism 106, such as a laser, selectively discharges the photoconductive cylinder 102 in accordance with an image to be formed onto media 116, such as paper, as the photoconductive cylinder 102 continues to rotate. At least one rotating dispensing roller 108 transfers toner to the photoconductive cylinder 102 as the photoconductive cylinder 102 continues to rotate. The toner is deposited onto the photoconductive cylinder 102 typically just where the photoconductive cylinder 102 has been discharged, and thus in accordance with the image to be formed.

As the photoconductive cylinder 102 continues to rotate with the selectively transferred toner thereon, a rotating transfer roller 112 transfers the toner from the photoconductive cylinder 102 onto the media 116 that is advancing from left to right to left between the transfer roller 112 and a rotating impression roller 114. The photoconductive cylinder 102 rotates past a cleaning mechanism 120 to completely discharge its photoconductive surface and remove any remaining toner still thereon before repeating the described process via being charged by the charge roller 104.

Figure 2:
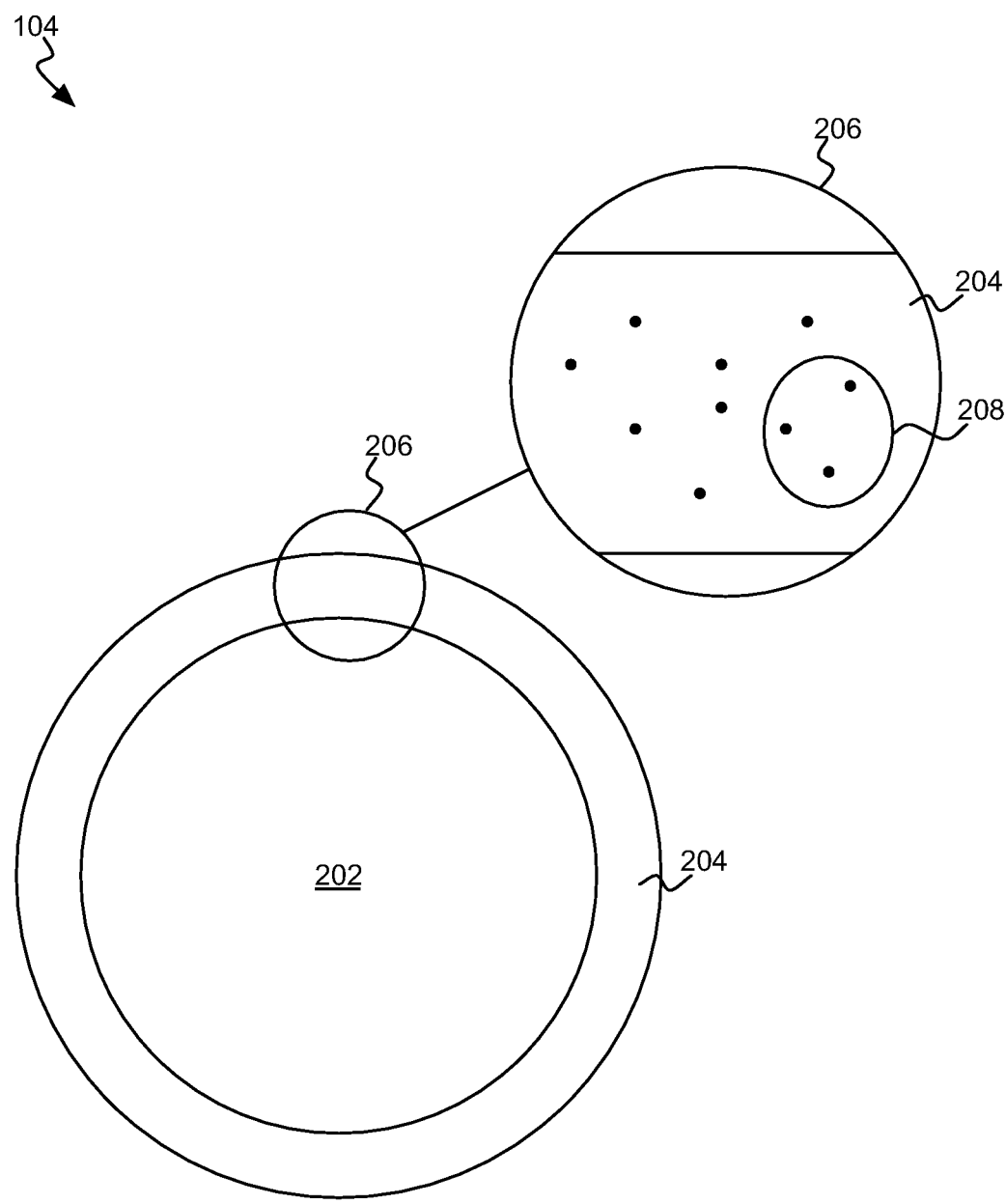
FIG. 2 is a diagram of an example charge roller for an electrophotographic printing device.

FIG. 2 shows an example of the charge roller 104 in more detail. The charge roller 104 has a cylindrical conductive substrate 202, which may be steel. The conductive substrate 202 receives a charge to transfer to the photoconductive surface of the photoconductive cylinder 102 of the electrophotographic printing device 100. The charge roller 104 further includes a resistive film 204 or coating, such as a ceramic film or coating, applied thereto to reduce high intensity discharge events while the photoconductive surface of the printing device 100 is being charged. The resistive film 204 may be alumina-titania (Al2O3-TiO2), for instance.

A portion 206 of the resistive film 204 of the charge roller 104 is shown in magnified fashion in FIG. 2. Specifically, the charge roller 104 includes ductile particles 208 disposed substantially uniformly throughout the resistive film 204 to reduce brittleness of the film 204, decreasing potential for delamination of the film 204 from the conductive substrate 202 during application, and permitting the thickness of the film 204 to be increased without cracking of the film 204. As described above, the dispersal of the ductile particles 208 throughout the resistive film 204 further increases the maximum operating gap 122 between the photoconductive cylinder 102 and the charge roller 104 while maintaining or ensuring print quality.

In one implementation, the ductile particles 208 are a metal or metal alloy, such as a nickel aluminum (NiAl) alloy. Testing has shown that when such ductile particles 208 are dispersed within a resistive film 204 of Al2O3-TiO2 at five percent by weight, which is 2.5% by volume, brittleness of the resulting film 204 is greatly reduced. Specifically, brittleness of the resistive film 204 is reduced sufficiently to avoid cracking and delamination during application on the conductive substrate 202 at thicknesses up to two millimeters. This represents an increase of more than 300% as compared to an Al2O3-TiO2 resistive film 204 that does not have such NiAl ductile particles 208 dispersed substantially uniformly therein.

More generally, the ductile particles 208 can be of a particular resistivity, size, and/or density that permits the thickness of the resistive film 204 to be increased to achieve the advantages and benefits associated with such increased thickness that have been described. As to resistivity, the greater the resistivity of the ductile particles 208, the less likely the inclusion of the particles 208 within the resistive film 204 will cause deleterious effects on print quality. However, for many types of materials, ductility is at odds with resistivity, such that a balance has to be drawn between ductility and resistivity. In general, two classes of ductile inclusion may be suitable: metals having a resistivity in the range of $5 \times 10^{-6}$ to $100 \times 10^{-6}$ Ohm-centimeters, and non-stoichiometric metal oxides having a resistivity in the range of $10^{-4}$ to $10^3$ Ohm-centimeters.

Specifically, ductile metallic materials, such as NiAl, can be replaced with a high electrical resistivity material that still has sufficient ductility to afford the advantages associated with inclusion of the ductile particles 208 within the resistive film 204 to reduce brittleness. As noted above, most metals have electrical resistivity in the range of $5 \times 10^{-6}$ to $100 \times 10^{-6}$ Ohm-centimeters. Electrical resistivity of stoichiometric metal oxides range from about $10^3$ to $10^{13}$ Ohm-centimeters, but stoichiometric metal oxides are not usually ductile. However, ductility can be improved by adding metal beyond the stoichiometric composition, although doing so reduces resistivity. Still, the resistivity of non-stoichiometric metal oxides can be many orders of magnitude higher than for metals.

Taking the above into account, examples of non-stoichiometric metal oxides that can be employed as the ductile particles 208 include magnesium oxide ($MgO_x$), titanium oxide ($TiO_x$), zirconium oxide ($ZrO_x$), hafnium oxide ($HfO_x$), tantalum oxide ($TaO_x$), chromium oxide ($CrO_x$), cobalt oxide ($CoO_x$), iron oxide ($FeO_x$), copper oxide ($CuO_x$), aluminum oxide ($AlO_x$), and zinc oxide ($ZnO_x$). The resistivity range of such ductile particles 208 is within $10^{-3}$ to $10^3$ Ohm-centimeters, which is sufficiently high not to cause deleterious effects on print quality.

Metal silicides and amorphous metal-based alloys, which are in the class of metals, can also have higher resistivity than crystalline metals, but with resistivity generally less than $10^{-3}$ Ohm-centimeters, such inclusions may affect print quality. Examples of metal silicides include molybdenum silicide (MoSi2), tungsten silicide (WSi2), titanium silicide (TiSi2), magnesium silicide (Mg2Si), chromium silicide (Cr3Si), and NiSi. Examples of amorphous metal-based alloys include cobalt zirconium (CoZr), cobalt zirconium boron (CoZrB), molybdenum tungsten silicon (MoWSi), molybdenum tantalum boron (MoTaB), and cobalt hafnium silicon (CoHfSi).

As to size and density, in general with decreasing particle size within the resistive film 204 comes a reduction of any negative impact on print quality resulting from the ductile particles 208. Particles can be generally described as ellipsoids, with most typical geometries being spheres or disks. Size can be important when considering metal, or other low resistivity (i.e., less than $10^{-3}$ Ohm-centimeters) ductile inclusions. The diameter of metal particles is desirably less than about five microns, such as about two microns. Increasing particle resistivity relaxes the constraint on particle diameter. The maximum diameter for non-stoichiometric metal oxide particles is about fifty microns. Particle geometry depends on the method of film deposition, such as thermal spraying, as is described in detail later in the detailed description. It is noted that the sizes mentioned herein are for disk diameters of thermally sprayed materials, and sphere diameters may be somewhat lower.

The volume density of ductile particles within the high resistivity coating is desirably below the percolation threshold for creating a continuous string of ductile particles across the thickness of the film. Exceeding the percolation threshold leads to localized high conductivity paths that short circuit the high resistivity coating. The percolation threshold is a function of particle geometry and orientation within the film. For spherical inclusions, percolation threshold is usually about 25%, whereas for randomly oriented oblate ellipsoids with an aspect ratio of ten, percolation threshold drops to generally 10%. Ductile metal particle concentration in thermally sprayed resistive coatings is desirably between 2% and 10% by volume. The density range can be extended to 15% for ductile non-stoichiometric metal oxide particles.

Figure 3:
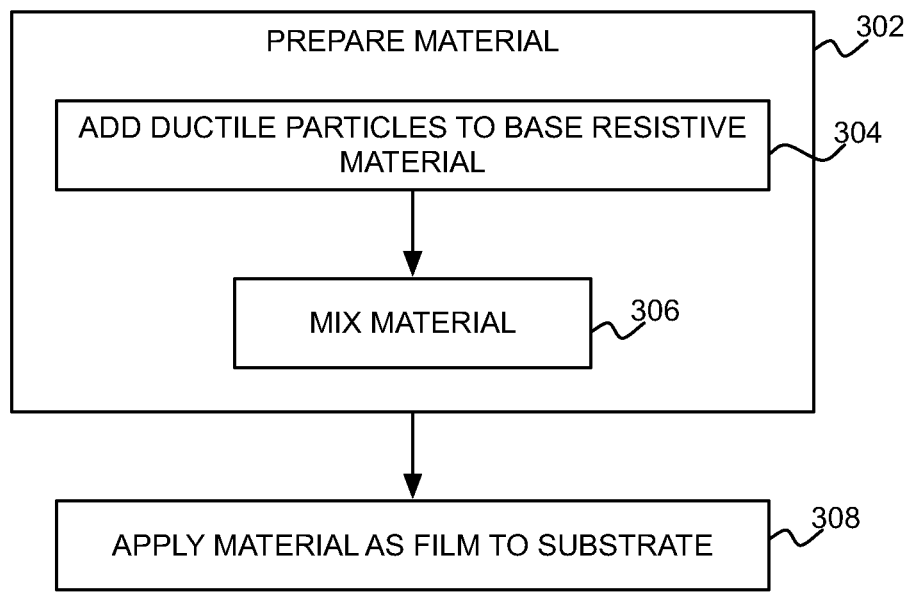
FIG. 3 is a flowchart of an example method for applying a resistive film having ductile particles therein to a substrate like a charge roller for an electrophotographic printing device.

FIG. 3 shows an example method 300 for forming a resistive film having ductile particles dispersed substantially uniformly therein on a substrate. The method 300 can be employed, for instance, to prepare the charge roller 104 that has been described. A material is prepared that includes a base resistive material and ductile particles dispersed substantially uniformly therein (302). The base resistive material may be ceramic particles, such as Al2O3-TiO2, and the ductile particles may be NiAl.

Preparing the material can include adding the ductile particles to the base resistive material particles (304), and thoroughly mixing the resulting material to disperse the ductile particles substantially uniformly throughout the material (306). Substantially uniformly means that the ductile particles are uniformly distributed throughout the material as much as possible. Perfect uniformity is unachievable due to randomness, entropy, and so on, but thoroughly mixing the material after the ductile particles have been introduced for a sufficient length of time results in substantial uniformity.

The resulting material is applied as a film to a substrate at a desired thickness (308), where the ductile particles reduce the brittleness of the film, permitting greater thickness than otherwise would be possible. Application can be performed by thermal spraying of the material onto the substrate to coat the substrate with the film. Thermal spraying includes flame spraying, plasma spraying, and high velocity oxy-fuel deposition techniques. The material is fed in powder form, typically in diameters of five to fifty micron, into a high temperature flame that melts the particles and propels them towards the substrate, where the molten particles spread into "splats" and are quickly quenched into solid form as disks. Orientation of the disks is parallel to the substrate plane, so the percolation threshold that has been described is higher than for randomly oriented disks. Extreme temperature gradients and cooling rates lead to stresses in thermally sprayed films, which increase in magnitude with film thickness. However, negative effects of such stresses are reduced by the introduction of the ductile particles, as has been described.

Figure 4:
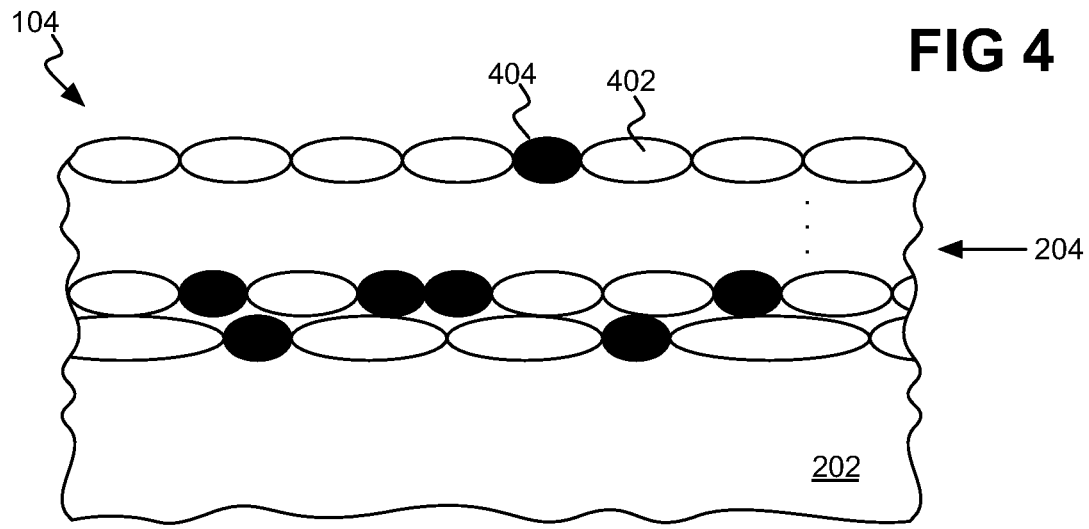
FIG. 4 is a diagram of an example thermally sprayed resistive film on a substrate.

FIG. 4 shows an example of a thermally sprayed resistive film 204 on the conductive substrate 202 of a charge roller 104. The thermally sprayed film 204 is grown on the conductive substrate 202 by successive deposition of particles. The particles include particles 402 that make up the bulk of film 204, and ductile particles 404. It is noted that the film 204 as depicted in FIG. 4 is exaggerated for illustrative clarity. In actuality, the particles may be considered as being more pancake-shaped and randomly stacked, with fewer voids therebetween. Furthermore, the aspect ratio of the particles 402 that are ceramic is usually between 10:1 and 50:1, whereas the aspect ratio of the ductile particles 404 that are metal is usually between 2:1 and 10:1. It is also noted that more generally, particles can be of variously different and random shapes, in addition to those described herein.

The sizes of the ductile particles that have been referenced above can refer to the diameter of the disks created in the thermal spraying process. The thickness of the disks is generally on the order of one micron, independent of disk diameter. Particles having a diameter of less than five micron are difficult to produce by some processing techniques like thermal spraying. Therefore, the ductile particles may have a diameter of as close to five microns as possible, such as within the range of five to ten microns. Powder source material used in thermal spray systems is typically greater than five microns in diameter.

Figure 5A:
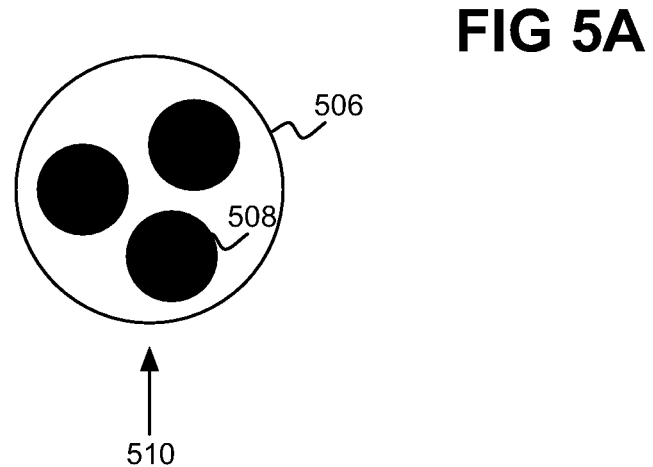
FIGS. 5A and 5B are diagrams of example powder source materials for thermally spraying a resistive film on a substrate.
Figure 5B:
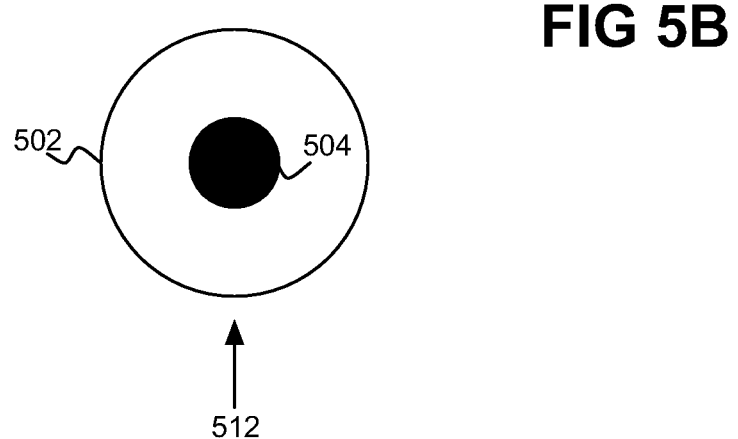

However, FIGS. 5A and 5B show two example powder source materials that can be used to realize ductile inclusions with diameters of less than five microns. In FIG. 5A, a powder source particle 510 is made up of two types of materials: a resistive material 506, such as a ceramic, and a ductile material 508, such as a metal. The source powder is made as a two phase mixture, for example, part high resistivity ceramic and part ductile conductive metal. By adjusting the ratio of the components in the two phase mixture, the volume of the ductile component can be controlled. In this manner the size of the ductile inclusions can be made as small as desired. The resulting powder source material can be referred to as a ceramic-metal composite source powder, for instance.

In FIG. 5B, the powder source material is a type of two phase mixture referred to as a core-shell particle 512. In the example of FIG. 5B, the particle 512 has an inner ductile particle 504 encapsulated by a resistive material coating 502. A core-shell particle 512 of the kind depicted in FIG. 5B can be realized by partial oxidation of a metal particle. In both FIGS. 5A and 5B, the ductile component of the particle can have a volume equivalent to a sphere of less than five microns in diameter.

We claim:

1. A charge roller for an electrophotographic printing device, comprising:
   a cylindrical conductive substrate adapted to charge a photoconductive surface of the electrophotographic printing device;
   a resistive film applied to the cylindrical conductive substrate to reduce high intensity discharge events while the photoconductive surface is being charged; and
   a plurality of ductile particles disposed substantially uniformly throughout the resistive film to reduce brittleness of the resistive film.

2. The charge roller of claim 1, wherein dispersal of the ductile particles throughout the resistive film provides for a thickness of the resistive film to be increased.

3. The charge roller of claim 1, wherein dispersal of the ductile particles throughout the resistive film provides for an increase in a maximum operating gap between the cylindrical conductive substrate and the photoconductive surface while ensuring print quality of the electrophotographic printing device to be maintained.

4. The charge roller of claim 1, wherein dispersal of the ductile particles throughout the resistive film provides for a reduction in occurrence of high intensity streamers.

5. The charge roller of claim 1, wherein the ductile particles comprise a material having a resistivity within a range of $10^{-4}$ to $10^{3}$ Ohm-centimeters.

6. The charge roller of claim 1, wherein one or more of:
the ductile particles each have a particle size within the range of two-to-fifty microns in diameter;
the ductile particles have a density within the resistive film of two to fifteen percent by volume.

7. The charge roller of claim 1, wherein the ductile particles comprise one of a:
a metal having a resistivity in a range of $5 \times 10^{-6}$ to $100 \times 10^{-6}$ Ohm-centimeters;
a non-stoichiometric metal oxide having a resistivity in a range of $10^{-4}$ to $10^{3}$ Ohm-centimeters.

8. The charge roller of claim 1, wherein the ductile particles comprise a nickel aluminum alloy.

9. The charge roller of claim 1, wherein the ductile particles are substantially 2.5% by volume within the resistive film.

10. An electrophotographic printing device comprising:
a photoconductive surface;
a charge roller to charge the photoconductive surface, the charge roller having a ceramic coating, a plurality of ductile particles dispersed substantially uniformly throughout the ceramic coating; and
an optical discharge mechanism to selectively discharge the photoconductive surface in accordance with an image to be formed on media.

11. A method comprising:
preparing a material that includes a base resistive material and a plurality of ductile particles dispersed substantially uniformly therein; and
applying the material as a film to a substrate, the ductile particles reducing brittleness of the film.

12. The method of claim 11, wherein preparing the material comprises:
adding the ductile particles to the base resistive material; and
thoroughly mixing the material to disperse the ductile particles substantially uniformly therein.

13. The method of claim 11, wherein applying the material as the film to the substrate comprises thermally spraying the material onto the substrate to coat the substrate with the film.

14. The method of claim 11, wherein preparing the material comprises preparing the material as a two-phase mixture of the base resistive material and a ductile material in a predetermined ratio.

15. The method of claim 11, wherein preparing the material comprises preparing the material as a two-phase mixture including the ductile particles encapsulated by the base resistive material via partially oxidizing the ductile particles.

* * * * *